(12) United States Patent
Sung et al.

(10) Patent No.: US 7,342,452 B2
(45) Date of Patent: Mar. 11, 2008

(54) CONTROL CIRCUIT FOR OPERATIONAL AMPLIFIER AND METHOD THEREOF

(75) Inventors: Kuang-Feng Sung, Taichung County (TW); Yueh-Hsiu Liu, Taipei (TW); Wei-Ta Chiu, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 233 days.

(21) Appl. No.: 11/162,728

(22) Filed: Sep. 21, 2005

(65) Prior Publication Data

US 2006/0238249 A1    Oct. 26, 2006

(30) Foreign Application Priority Data

Apr. 21, 2005    (TW) ................................ 94112667 A

(51) Int. Cl.
*H03F 3/45* (2006.01)
(52) U.S. Cl. .................... 330/261; 330/257; 330/10
(58) Field of Classification Search ............... 330/261, 330/257, 10
See application file for complete search history.

(56) References Cited

U.S. PATENT DOCUMENTS

| | | | | |
|---|---|---|---|---|
| 3,848,195 A * | 11/1974 | Kiko | ........................ | 330/261 |
| 5,675,288 A * | 10/1997 | Peyrotte et al. | ............. | 330/149 |
| 6,614,309 B1 * | 9/2003 | Pehlke | ...................... | 330/296 |
| 6,753,735 B2 * | 6/2004 | Arai et al. | .................. | 330/297 |
| 7,072,626 B2 * | 7/2006 | Hadjichristos | .............. | 455/126 |
| 7,170,352 B1 * | 1/2007 | Caldwell | .................... | 330/261 |

* cited by examiner

*Primary Examiner*—Patricia Nguyen
(74) *Attorney, Agent, or Firm*—Jianq Chyun IP Office

(57) ABSTRACT

A control circuit for an operational amplifier and a method thereof are provided to dynamically modulate the operational amplifier for strong driving capability and power saving. The control circuit comprises a bias unit coupled to the operational amplifier and a control unit coupled to the bias unit. The bias unit normally outputs a bias signal to bias the operational amplifier so that the operational amplifier has a first driving capability. However, when the driving capability of the operational amplifier needs to be adjusted, the control unit receives a modulating signal and outputs a control signal according to the modulating signal. When the bias unit receives the control signal, the bias unit dynamically modulates the bias signal according to the control signal, and hence the driving capability of the operational amplifier is dynamically modulated in an indirect manner.

15 Claims, 3 Drawing Sheets

CONTROL CIRCUIT FOR OPERATIONAL AMPLIFIER AND METHOD THEREOF

CROSS-REFERENCE TO RELATED APPLICATION

This application claims the priority benefit of Taiwan application serial no. 94112667, filed on Apr. 21, 2005. All disclosure of the Taiwan application is incorporated herein by reference.

BACKGROUND OF THE INVENTION

1. Field of the Invention

The present invention relates to an operational amplifier. More particularly, the present invention relates to a control circuit for an operational amplifier for dynamically modulating the driving capability operational amplifier and a method thereof.

2. Description of the Related Art

Operational amplifiers are now commonly applied in various kinds of circuits. For example, operational amplifiers are used in the amplifier circuit for processing large signal amplification or the driving circuit for driving a capacitive load. Furthermore, digital-to-analog converters (DAC) or analog-to-digital converters (ADC) also require operational amplifiers. In addition, because liquid crystal displays (LCD) need to drive a lot of pixel capacitors, a highly efficient and power-saving driving device is desired.

A conventional operational amplifier is biased by a bias unit so that the operational amplifier can provide enough current to drive external loads. In general, the bias unit converts a fixed reference current into a bias signal in the form of voltage or current, and then the bias unit uses the bias signal to bias the operational amplifier. Therefore, once the reference current is fixed, the driving capability of the operational amplifier for driving external loads is also determined.

Under the consideration of the slew rate and the driving capability, the bias voltage applied to the operational amplifier can be designed to be higher so that the output current from the operational amplifier can be larger. Hence, larger output current leads to faster the level transition speed of the signal, and leads to higher slew rate to driving a larger external load. However, larger output current of the operational amplifier will also lead to higher power consumption. Since there is no mechanism for adjusting the current according to the actual need, current is wasted at the input terminal due to the fixed input voltage. This is a serious drawback for a power-saving device.

Under the consideration of the power saving, the bias signal applied to the operational amplifier can be designed to be smaller so that the output current from the operational amplifier can be smaller. Although some power is saved due to a lower operating current, a lower slew rate and a weaker driving capability will be the price.

SUMMARY OF THE INVENTION

In accordance with one aspect of the present invention, there is a control circuit provided for an operational amplifier for dynamically modulating the driving capability of the operational amplifier.

In accordance with another aspect of the present invention, it is provided an operational amplifier device, in which the driving capability can be dynamically modulated.

In accordance with yet another aspect of the present invention, there is a method provided for controlling an operational amplifier which has a stronger driving capability during a predetermined time period in the initial stage, and returns to a normal driving capability after the predetermined time period. Thus, the operational amplifier can have a stronger driving capability and lower power consumption.

To achieve these and other advantages and in accordance with the purpose of the invention, as embodied and broadly described herein, the invention provides a control circuit for an operational amplifier. The control circuit comprises a control unit and a bias unit. The control unit is coupled to the bias unit and the bias unit is coupled to the operational amplifier. The control unit receives a modulating signal and outputs a control signal according to the modulating signal. According to the control signal, the bias unit adjusts and outputs a bias signal to bias the operational amplifier and dynamically determines the driving capability of the operational amplifier.

In other words, the bias unit normally outputs a bias signal to bias the operational amplifier so that the operational amplifier has a first driving capability. However, when the driving capability of the operational amplifier needs to be adjusted, the control unit will receive a modulating signal and outputs a control signal accordingly. When the bias unit receives the control signal, the bias signal is dynamically modulated according to the control signal so that the driving capability of the operational amplifier is dynamically modulated in an indirect manner. The bias signal can be a current signal or a voltage signal.

The present invention also provides an operational amplifier device in which the driving capability can be dynamically modulated. The operational amplifier device comprises a control unit, a bias unit and an operational amplifier. The control unit is coupled to the bias unit and the bias unit is coupled to the operational amplifier. The control unit receives an externally provided modulating signal and outputs a control signal according to the modulating signal. According to the control signal, the bias unit modulates and outputs a bias signal so that the driving capability of the operational amplifier is dynamically modulated. The operational amplifier receives the dynamically-modulated bias signal and uses the signal to set its driving capability. In reality, the driving capability of the operational amplifier is the driving capability of the operational amplifier device.

In other words, the bias unit normally outputs a bias signal to bias the operational amplifier so that the operational amplifier (or device) has a first driving capability. However, when the driving capability of the operational amplifier (or device) needs to be adjusted, the control unit will receive a modulating signal and output a control signal accordingly. When the bias unit receives the control signal, the bias signal is dynamically modulated according to the control signal so that the driving capability of the operational amplifier (or device) is dynamically modulated in an indirect manner. The bias signal can be a current signal or a voltage signal.

In one embodiment of the present invention, the control unit comprises a timer. The timer is provided for counting a predetermined time period according to the timing sequence for modulated signal. During the predetermined time period, the control unit sets the operational amplifier (or device) to operate at a first driving capability by sending a control signal to the operational amplifier (or device) via the bias unit. After the end of the predetermined time period, the control unit sets the operational amplifier (or device) to operate at a second driving capability by sending another control signal to the operational amplifier (or device) via the bias unit. In addition, the timer can also set the time length of the predetermined time period. For example, the data regarding the time length of the predetermined time period may be embedded within the modulated signal so that the timer can set the time length of the predetermined time period according to the modulated signal.

The present invention also provides a method for controlling the operational amplifier, wherein the driving capability of the operational amplifier is dynamically determined according to a bias signal. The method comprises receiving a modulating signal and counting a predetermined time period according to the timing sequence of the modulating signal. During the predetermined time period, the bias signal is modulated so that the operational amplifier has a first driving capability. After the end of the predetermined time period, the bias signal is modulated so that the operational amplifier has a second driving capability. The first driving capability is stronger than the second driving capability and the aforementioned bias signal can be a current signal or a voltage signal. Additionally, the method of the operational amplifier may include setting the time length of the predetermined time period.

Therefore, according to the control circuit for controlling an operational amplifier, the method and the operational amplifier device of the present invention, the operational amplifier (or device) has a stronger driving capability during a predetermined time period in the initial stage. After the end of the predetermined time period, the operational amplifier (or device) returns to a normal driving capability. Hence, the operational amplifier (or device) is able to provide stronger driving capability and saves the power. The present invention can be applied to amplify large signals (for example, signals that rises rapidly from 0 V to 10 V), to drive a capacitive load (for example, the storage capacitors of the pixels in the liquid crystal display panel), or to control digital-to-analog converters (DAC), analog-to-digital converters (ADC), the operational amplifiers of sample-and-hold circuits, or others.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
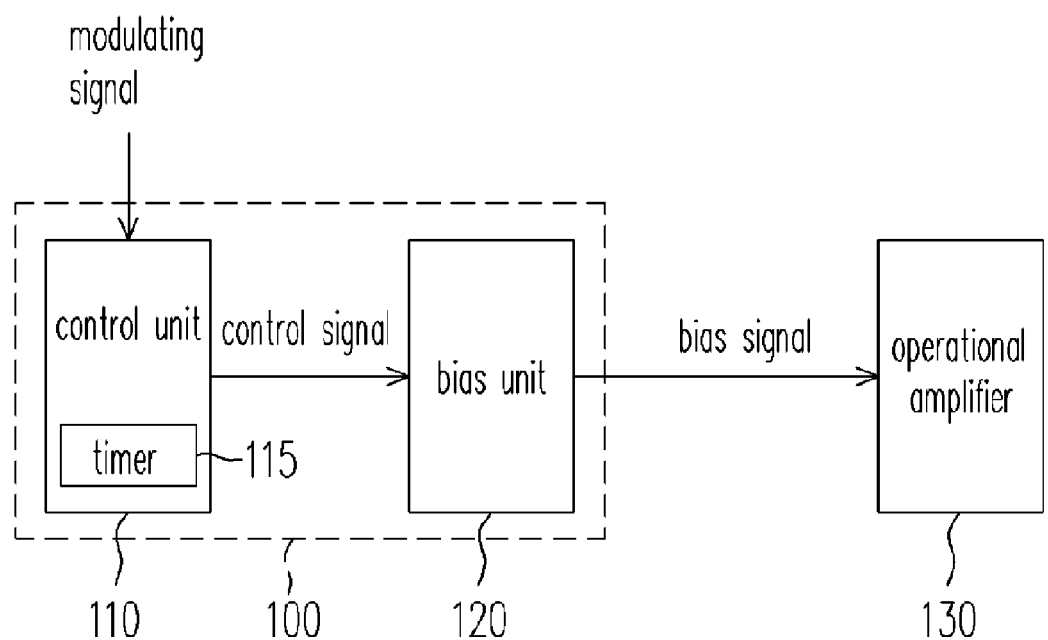
FIG. 1 is a block diagram showing the control circuit of an operational amplifier according to one embodiment of the present invention.

Reference will now be made in detail to the embodiments of the present invention, examples of which are illustrated in the accompanying drawings. Wherever possible, the same reference numbers are used in the drawings and the description to refer to the same or like parts.

FIG. 1 is a block diagram showing the control circuit of an operational amplifier according to one embodiment of the present invention. As shown in FIG. 1, the operational amplifier device 10 comprises an operational amplifier 130 and a control circuit 100. The control circuit 100 of the operational amplifier 130 comprises a control unit 110 and a bias unit 120. The control unit 110 is coupled to the bias unit 120 and the bias unit 120 is coupled to the operational amplifier 130.

Under normal working conditions, the bias unit 120 outputs a bias signal to bias the operational amplifier 130 so that the operational amplifier 130 can output a normal current. In other words, the operational amplifier 130 has a second driving capability. When the driving capability of the operational amplifier 130 needs to be adjusted (for example, the operational amplifier 130 needs to output a larger current), the control unit 110 would output a control signal to the bias unit 120 according to the received modulating signal. According to the control signal, the bias unit 120 dynamically modulates the bias signal and hence indirectly modulates the driving capability of the operational amplifier 130. In general, the bias signal can be designed as a current signal or a voltage signal depending on practical requirements.

Using the processing of a large signal as an example, the driving capability of the operational amplifier 130 is modulated by a bias signal to output a larger current during a predetermined time period (for example, the initial period for the transition of the processed signal). That is, the operational amplifier 130 has a first driving capability (for example, the first driving capability is stronger than the second driving capability). As a result, the operational amplifier device 10 can rapidly change the output conditions through strong driving capability and large slew rate. After the end of the predetermined time period, the control unit 110 controls the bias unit 120 to provide the original bias signal so that the operational amplifier 130 can operate with a normal current, from the first driving capability to the second driving capability after the predetermined time period. With this arrangement, a stronger driving capability is provided whenever the output signal needs to be changed rapidly and a normal driving capability is maintained in other period for saving the power.

Because the driving capability of the operational amplifier 130 is switched from the first driving capability back to the second driving capability after a predetermined time period, a timer 115 is disposed inside the control unit 110. According to the timing sequence of the modulating signal, the timer starts counting the predetermined time period. Furthermore, the timer 115 may set the time length of the predetermined time period according to an external data (for example, through the modulating signal or other signal) so that the control circuit 100 can be used for other operations or designs.

Figure 2:
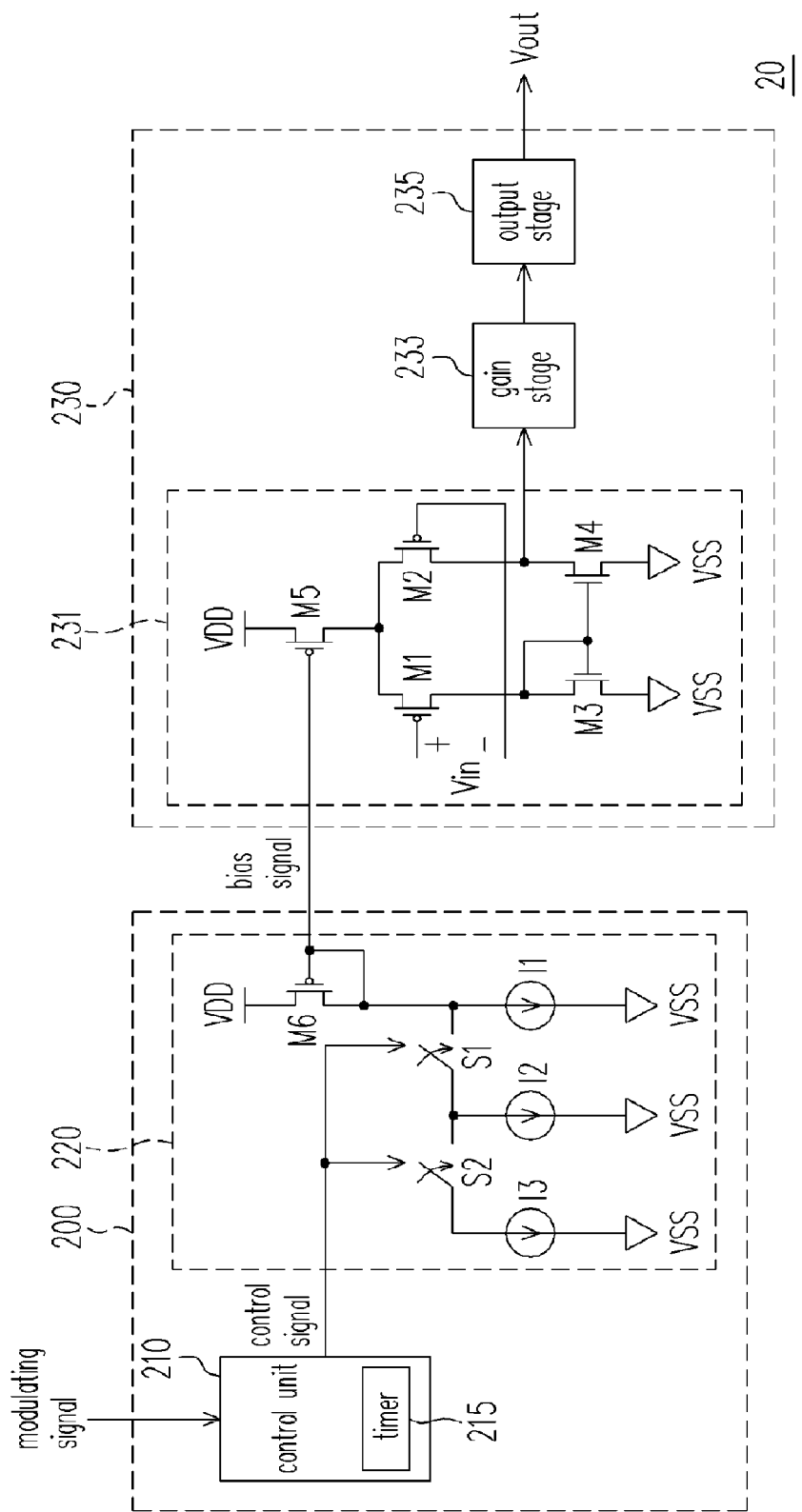
FIG. 2 is a circuit diagram of the control circuit of an operational amplifier according to one embodiment of the present invention.

FIG. 2 is a circuit diagram of the control circuit of an operational amplifier according to one embodiment of the present invention. As shown in FIG. 2, the operational amplifier device 20 comprises an operational amplifier 230 and a control circuit 200. The operational amplifier 230 has an input stage 231, a gain stage 233 and an output stage 235, wherein the power supplies VDD and VSS provide the necessary operating power, and Vin and Vout are input and output signals respectively. Anyone familiar with this field may know the operating principle of the operational amplifier. Furthermore, the control circuit 200 of the operational amplifier 230 comprises a control unit 210 and a bias unit 220. The control unit 210, for example, comprises a timer 215.

Here, only the input stage 231 of the operational amplifier 230 is illustrated as an example. The input stage 231 comprises a plurality of transistors M1~M5. The gate of the transistor M5 receives a bias signal. According to the magnitude of the bias signal, the current passing through the transistor M5 is determined and the input stage is biased by this current. Obviously, the gain stage 233 and the output stage 235 can also be biased by the bias signal (not shown). Therefore, the magnitude of the bias signal determines the magnitude of the operating current flowing in the operational amplifier 230, so that the magnitude of the output current (i.e. a measure of the driving capability) produced by the operational amplifier 230 is also indirectly determined.

The bias signal for the operational amplifier 230 is produced by the bias unit 220 from a current source I1 through a current mirror (comprising the transistors M5 and M6) to provide a current through the transistor M5 to other transistors M1~M4. According to the control signal output from the control unit 210, when both switches S1 and S2 are opened, the only current source supplying the operational amplifier 230 is I1. The operational amplifier 230 outputs a normal current. In other words, the operational amplifier 230 has a second driving capability. When a larger current is needed from the operational amplifier 230, the switch S1 is closed by the control signal, so that the current source supplying the operational amplifier 230 becomes I1+I2. If both the switch S1 and the switch S2 are closed, the current source supplying the operational amplifier becomes I1+I2+I3. In general, the magnitude of the current provided by each of the current sources I1~I3 or the number of current sources can be designed according to actual requirements.

Figure 3:
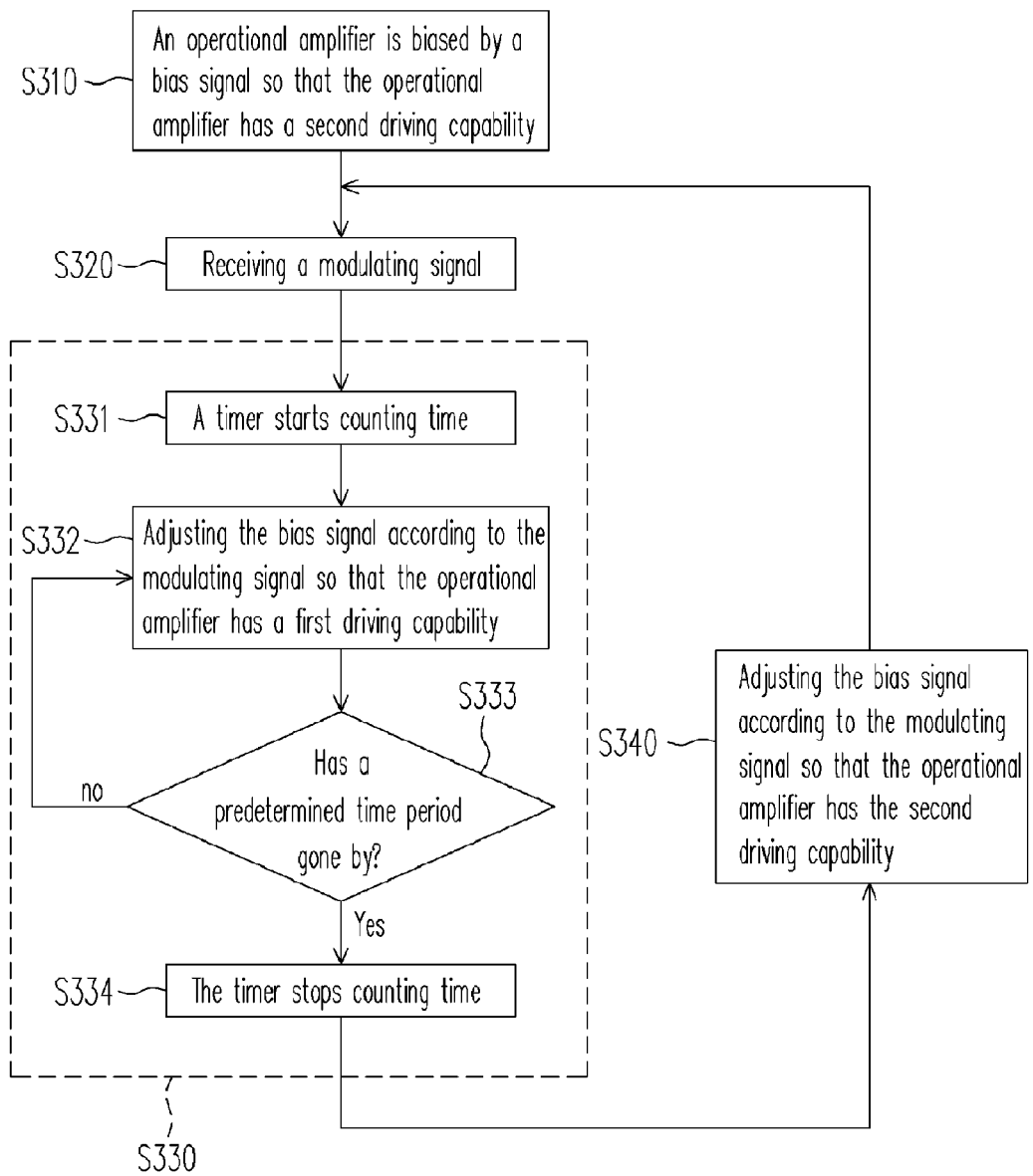
FIG. 3 is a flow chart showing the method for controlling an operational amplifier according to one embodiment of the present invention.

FIG. 3 is a flow chart showing the method for controlling an operational amplifier according to one embodiment of the present invention. To simplify the explanation, please also refer to the circuit block diagram in FIG. 1. As shown in FIG. 3, in step S310, the operational amplifier 130 is biased by the bias signal to operate with a second driving capability. In other words, the operational amplifier 130 outputs a normal current.

In step S320, for dynamically modulating the driving capability of the operational amplifier 130, a modulating signal is supplied to the control unit 110. After receiving the modulating signal from an external environment, the control unit 110 adjusts the bias signal for biasing the operational amplifier 130 according to the modulating signal. As a result, the operational amplifier 130 is switched from the second driving capability to a first driving capability and maintains in this driving state for a predetermined time period. For example, the first driving capability is stronger than the second driving capability. In other words, the operational amplifier 130 changes from a device outputting a normal current to a device outputting a larger current.

In step S340, the bias signal for biasing the operational amplifier 130 is adjusted according to the modulating signal so that the operational amplifier goes from the first driving capability to the original second driving capability. Therefore, when necessary, the operational amplifier 130 can provide a stronger driving capability during a predetermined time period to change the output signal rapidly, and return to a normal driving capability after the predetermined time period to save the power.

The next step S330 further includes a few steps S331~S334. In step S331, the timer 115 starts counting time. In step S332, the bias signal for biasing the operational amplifier 130 is adjusted according to the received modulating signal so that the operational amplifier 130 has a first driving capability. In other words, the operational amplifier 130 can output a larger current. Then, in step S333, the timer 115 is checked to determine if the predetermined time period has gone by. If the predetermined time period has gone by, the step goes to S334 and the timer 115 stops counting time. If not, the step goes back to S332 and continues biasing the operational amplifier 130 so that it has the first driving capability.

In addition, the method for controlling the operational amplifier comprises setting the time length of the predetermined time period. Anyone familiar with the technique may use various methods to establish a mechanism for setting the time length of the predetermined time period. For example, the time length of the predetermined time period may be designed to be embedded within the modulating signal so that the timer 115 of the control unit 110 is set accordingly. Ultimately, the timer 115 starts counting the predetermined time period according to the timing sequence of the modulating signal. In the aforementioned method, the bias signal can be a current signal or a voltage signal.

In summary, the driving capability of the operational amplifier (or device) according to the present invention is dynamically modulated for the purpose of stronger driving capability and power saving. Hence, the operational amplifier can be applied to amplify large signals (for example, signals that rises rapidly from 0 V to 10 V), to drive a capacitive load (for example, the storage capacitors of the pixels in the liquid crystal display panel), or to control digital-to-analog converters (DAC), analog-to-digital converters (ADC), the operational amplifiers of sample-and-hold circuits, or others.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A control circuit for an operational amplifier, comprising:

a control unit for receiving a modulating signal and outputting a control signal according to the modulating signal; and a bias unit coupled to the control unit and the operational amplifier, wherein the bias unit adjusts and outputs a bias signal to bias the operational amplifier according to the control signal so that the driving capability of the operational amplifier is dynamically modulated;

wherein the control unit sets the driving capability of the operational amplifier to a first driving capability through the bias unit controlled by the control signal during a predetermined time period, and sets the driving capability of the operational amplifier to a second driving capability through the bias unit controlled by the control signal after the predetermined time period, and the first driving capability and second driving capability are different.

2. The control circuit of claim 1, wherein the control unit comprises:

a timer for counting the predetermined time period according to the timing sequence of the modulating signal.

3. The control circuit of claim 2, wherein the timer further sets the time length of the predetermined time period according to the modulating signal.

4. The control circuit of claim 1, wherein the bias signal comprises a bias current.

5. The control circuit of claim 1, wherein the bias signal comprises a bias voltage.

6. An operational amplifier device having a dynamically-modulated driving capability, comprising:
   a control unit for receiving a modulating signal and outputting a control signal according to the modulating signal;
   an operational amplifier for receiving a bins signal and setting the driving capability of the operational amplifier accordingly; and
   a bias unit coupled to the control unit and the operational amplifier, wherein the bias unit adjusts and outputs the bias signal according to the control signal so that the driving capability of the operational amplifier is dynamically modulated;
   wherein the control unit sets the driving capability of the operational amplifier to a first driving capability through the bias unit controlled by the control signal during a predetermined time period, and sets the driving capability of the operational amplifier to a second driving capability through the bias unit controlled by the control signal after the predetermined time period, and the first driving capability and second driving capability are different.

7. The operational amplifier device of claim 6, wherein the control unit comprises:
   a timer for counting the predetermined time period according to the timing sequence of the modulating signal.

8. The operational amplifier device of claim 7, wherein the timer further sets the time length of the predetermined time period according to the modulating signal.

9. The operational amplifier device of claim 6, wherein the bias signal comprises a bias current.

10. The operational amplifier device of claim 6, wherein the bias signal comprises a bias voltage.

11. A method for controlling an operational amplifier, wherein the driving capability of the operational amplifier is dynamically modulated according to a bias signal, the method comprising:
    receiving a modulating signal;
    counting a predetermined time period according to the timing sequence of the modulating signal;
    setting the bias signal during the predetermined time period so that the operational amplifier has a first driving capability; and
    setting the bias signal after the predetermined time period so that the operational amplifier has a second driving capability;
    wherein the first and second driving capability are different.

12. The method of claim 11, further comprising setting the time length of the predetermined time period.

13. The method of claim 11. wherein the driving capability of the first driving capability is stronger than the driving capability of the second driving capability.

14. The method of claim 11, wherein the bias signal comprises a bias current.

15. The method of claim 11, wherein the bias signal comprises a bias voltage.

* * * * *